United States Patent [19]

Sharp

[11] Patent Number: 4,547,833
[45] Date of Patent: Oct. 15, 1985

[54] HIGH DENSITY ELECTRONICS PACKAGING SYSTEM FOR HOSTILE ENVIRONMENT

[75] Inventor: Stanley O. Sharp, Missouri City, Tex.

[73] Assignee: Schlumberger Technology Corporation, New York, N.Y.

[21] Appl. No.: 565,067

[22] Filed: Dec. 23, 1983

[51] Int. Cl.⁴ .............................................. H05K 7/20
[52] U.S. Cl. .................................... 361/386; 175/325; 361/331; 361/419; 174/52 R
[58] Field of Search ............ 174/52 R; 361/331, 334, 361/356, 380, 386, 388, 389, 390-395, 399, 417, 419, 420, 427, 429; 166/65 R; 175/40, 41, 320, 325

[56] References Cited

U.S. PATENT DOCUMENTS

| | | | |
|---|---|---|---|
| 3,534,229 | 10/1970 | Aungst | 361/331 |
| 3,911,217 | 10/1975 | Georgopulos | 361/331 |
| 4,190,123 | 2/1980 | Roddy | 175/325 |
| 4,400,858 | 8/1983 | Goiffon | 361/386 |
| 4,479,383 | 10/1984 | Bravenec | 73/151 |

FOREIGN PATENT DOCUMENTS 1280762 7/1972 United Kingdom .................. 174/27

Primary Examiner—G. P. Tolin

[57] ABSTRACT

An electronics packaging system suitable for the hostile operating environment of downhole MWD tools is disclosed which has a "Y"-shaped cross-sectional chassis on the periphery of which are attached a plurality of electronics modules in a "delta" configuration to give a rigid, high density assembly with convenient cabling channels running axially of the chassis. Roller supports or annular shoe supports provided on the chassis isolate the electronics from the vibration and shock forces experienced by the housing. The metal-elastomer-metal construction of the supports offers the resiliency needed for vibration dampening and shock absorption, as well as the rigidity needed for rolling and controlling the direction of application of the undissipated forces. Heat sinks are provided both above and below electronics elements to rapidly disseminate localized heat and to radiate heat generally through the housing walls to an external cooling medium.

2 Claims, 10 Drawing Figures

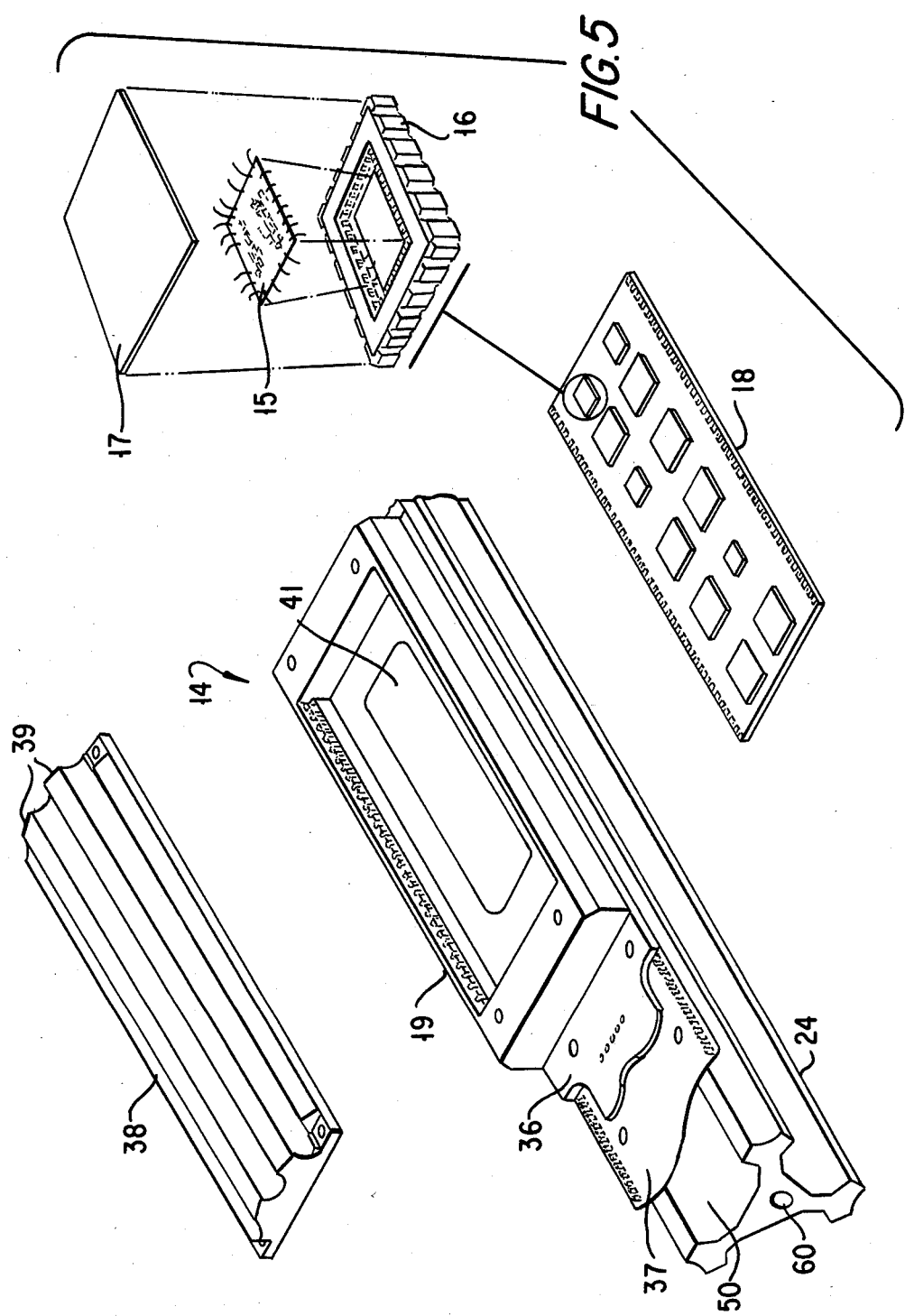

HIGH DENSITY ELECTRONICS PACKAGING SYSTEM FOR HOSTILE ENVIRONMENT

BACKGROUND OF THE INVENTION

1. Field of the Invention

This invention relates to electronics packaging systems in general; and, in particular, to systems for packaging electronic circuitry for instruments, e.g. measurements-while-drilling tools, which are subjected during operation to a harsh environment such as severe vibration and impact shocks, and high bending and torsional stresses.

2. Description of the Prior Art

With the ongoing technological advances in the art of drilling boreholes in the earth, typically oil and gas wells, more and more electronics has been used in downhole environments. The technology of measurements-while-drilling (MWD) has developed whereby measurements concerning the condition of the well are performed downhole while the well is being drilled. Electronic measuring tools are placed in series with the drilling string in proximity to the drilling bit.

The drilling environment of a drilling bit boring into earth formations is extremely hostile. The rotational forces of the bit being rotated at the end of a long string of drilling pipe driven by rotation from the surface have created reliability problems for downhole electronics in the measuring tools. Many of these problems have resulted from the shortcomings of the conventional technology available for packaging the electrical components.

In particular, the extremely high vibration set up in the drilling bit and collars above the bit, as well as the sudden impact shocks caused by the drilling process, have frequently caused prior art electronic instruments in proximity to the bit to fail. The electronic equipment that is used while drilling must be reliable enough to continue working during the lifetime of a drilling bit. Operators and drilling contractors find it unacceptable from a time delay and cost standpoint to interrupt drilling to replace electronic equipment.

SUMMARY OF THE INVENTION

It is a general object of the present invention to provide an improved electronic packaging system to increase the reliability of electrical circuitry, such as that used in oil industry MWD tools, for operation in a harsh environment.

It is another object of the invention to provide an improved packaging system for electronic circuitry having high bending and torsional stiffness and good resistance to shock and vibration.

It is still another object of the invention to provide an improved electronic packaging system that offers high packaging density, good heat transfer characteristics, easy access to electronic test points, and easy access for replacement of faulty components.

It is a further object of the invention to provide an improved electronic packaging system that enables easy interconnection of elements, establishes convenient electrical and/or hydraulic communication paths, and is configured for easy movement into and out of a protective housing.

These, and other objects, features and advantages are obtained in accordance with the present invention through the provision of a packaging system for electronic circuitry comprising an elongated chassis having a "Y"-shaped cross-section for mounting electronic circuit modules in a symmetrical configuration about its periphery. Preferably, the "Y"-shaped chassis is of unitary construction, having a central core and three arms extending radially therefrom at angles approximately 120° apart, permitting the mounting between adjacent pairs of arms of electronics modules in a "delta" configuration about the periphery of the chassis. The resulting high density package offers good bending and torsional stiffness, presents readily accessible test points and facilitates replacement of faulty components. The spaces between the chassis core and the mounted modules provide convenient passageways for electrical wiring.

In accordance with one aspect of the invention, support assemblies are axially-spaced along the chassis to mount the chassis within the interior of a protective housing. These assemblies serve to cradle the electronics within the housing so as to isolate it from vibration and shock. The assemblies comprise means to maintain the electronics packages away from the housing walls, means to dampen vibration and shock, and means to direct forces experienced by the housing away from the electronics.

In another aspect of the invention, means are provided to convey heat away from the electronic modules mounted between adjacent pairs of arms on the "Y"-shaped chassis. In one form, the heat dissipating means includes a radiating heat sink placed above the electronic components. A further form includes a heat transmitting metal plate placed below heat generating electronic components, and means thermally communicating the plate with the radiating heat sink.

There have thus been outlined rather broadly the more important objects, features, and advantages of the invention in order that the detailed description thereof that follows may be better understood and in order that the present contribution to the art may be better appreciated. There are, of course, additional features of the invention that will be described more fully hereinafter. Those skilled in the art will appreciate that the conception on which this disclosure is based may readily be utilized as the basis for the designing of other arrangements for carrying out the purposes of this invention. It is important, therefore, that this disclosure be regarded as including such equivalent arrangements as do not depart from the spirit and scope of the invention.

BRIEF DESCRIPTION OF THE DRAWINGS

Embodiments of the invention have been chosen for purposes of illustration and description, and are shown in the accompanying drawings forming a part of the specification, wherein:

FIG. 5 is an exploded perspective view illustrating details of the electronic modules of FIGS. 1 and 2;

Throughout the drawings, like reference numerals refer to like elements.

DESCRIPTION OF THE INVENTION

Figure 1:
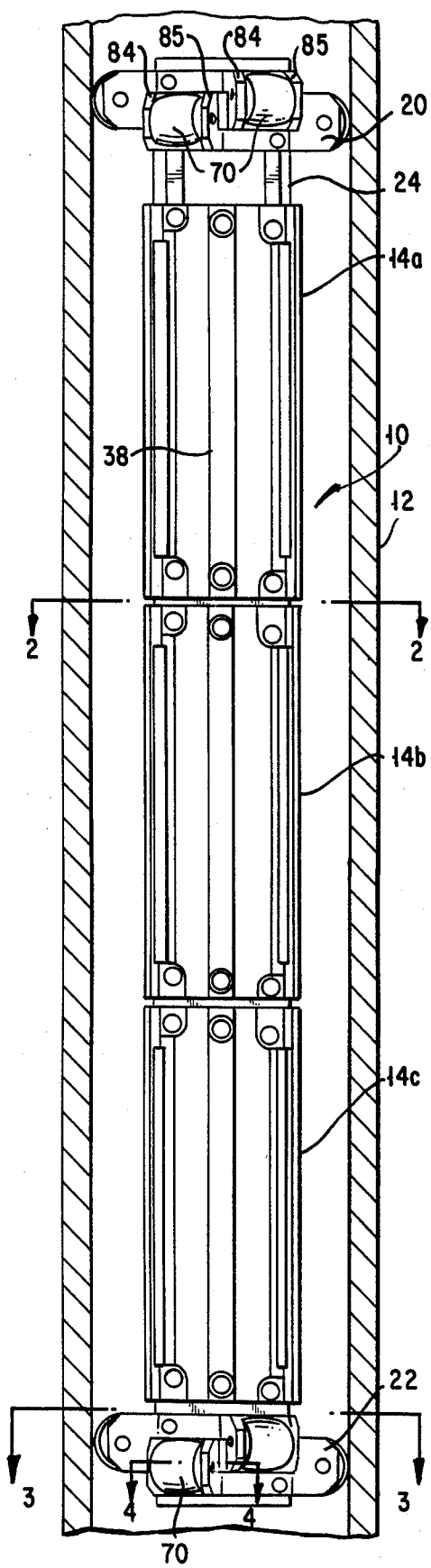
FIG. 1 is a top plan view of an embodiment of an electronics packaging system according to the invention, shown by way of example incorporated into the pressure housing of an MWD oilwell drilling tool.

FIGS. 1–5 illustrate an electronics packaging system according to a first embodiment of the invention usable for the packaging of the electronics circuitry of an MWD (measurements-while-drilling) tool which makes measurements of downhole drilling parameters and/or formation characteristics during the drilling of a well for the exploitation of subsurface hydrocarbons. The operating environment for such an MWD tool is extremely hostile. In addition, to exposure to high temperatures and pressures, MWD tools are subjected to the rigors of brutal vibrational forces, to sudden extreme impact forces due to jolting and jarring, and to the severe bending and torsional stresses experienced during rotary drilling by the entire drilling string.

An electronics packaging assembly 10 (FIG. 1) is inserted into a tubular protective housing 12 (shown in cross-section) which forms a part of the pressure housing, the outer surface of which is exposed within an MWD drill collar to the flowing drilling mud. Electronics modules 14a, 14b and 14c are positioned end-to-end axially of the assembly 10 on an elongated chassis 24. The assembly 10 is supported within the housing 12 by means of roller supports 20 and 22 provided adjacent the ends of the chassis 24.

Figure 2:
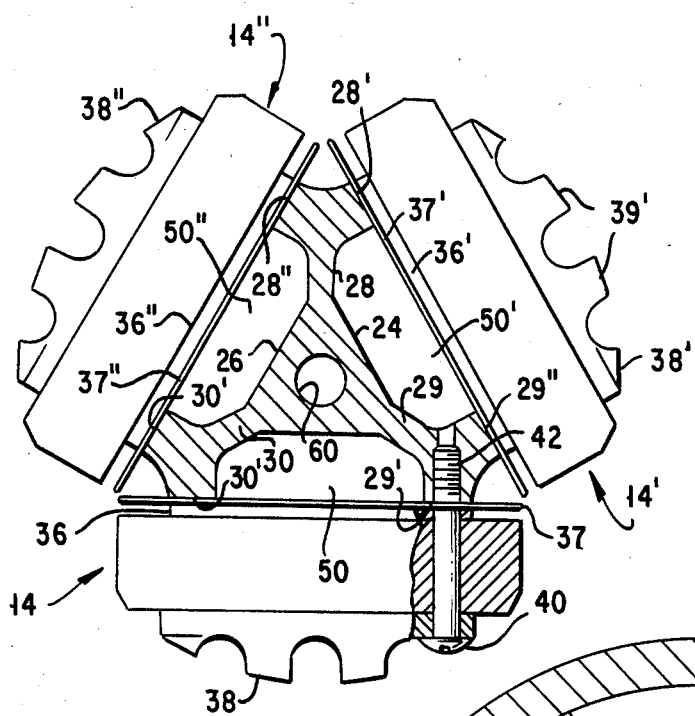
FIG. 2 is a section view taken along line 2—2 of FIG. 1.
Figure 3:
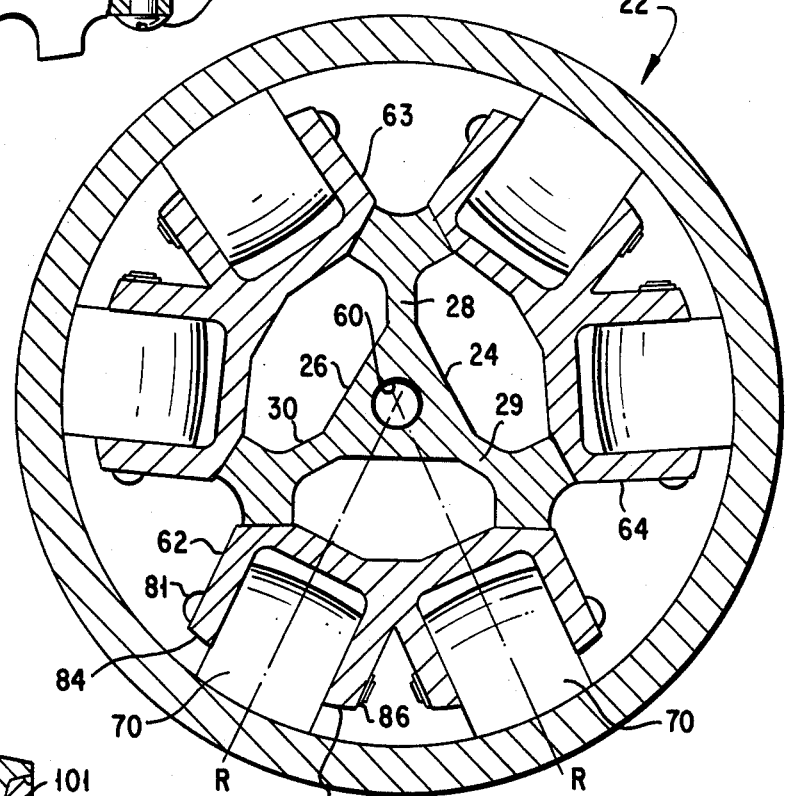
FIG. 3 is a section view taken along line 3—3 of FIG. 1.

As shown in FIGS. 2, 3 and 5, the chassis 24 of the electronics packaging assembly 10 has a generally "Y"-shaped cross-section with a central core 26 and three symmetrically arranged arms 28, 29 and 30 extending radially at approximately 120° angles from the core 26. Each arm terminates in a flange member which faces in two opposite directions. Arm 28 (see FIG. 2) terminates in a flange member having faces 28' and 28"; arm 29 terminates in a member having faces 29' and 29"; and arm 30 terminates in a member having faces 30' and 30". The flange member faces are oriented so that electronic modules may be mounted between adjacent pairs of the arms 28, 29 and 30 by securing them to respective adjacent faces. The electronic modules 14 shown in FIG. 1 are mounted to the adjacent faces 29' and 30" of the arms 29 and 30 (see FIG. 2). In the same way, a module 14' can be mounted between arms 28 and 29 by attachment to the faces 28' and 29", and a module 14" can be mounted between arms 28 and 30 by securing it to the faces 28" and 30'.

Thus, a plurality of electronics modules 14, 14' and 14" can be attached between respective adjacent pairs of the arms 28, 29 and 30 of the chassis 24 to present a "delta"-shaped configuration of modules about the periphery of the "Y"-shaped chassis 24. This provides a high density, rigid packaging structure with very good uniform bending and torsional stiffness, a feature that is extremely important for elements subjected to the stresses experienced by the drilling string during well drilling.

The chassis 24 should preferably be made of a rigid, heat-transmitting material such as stainless steel. (For MWD applications, a nonmagnetic material should be chosen to prevent interference with magnetic field sensor measurements.)

The form of the electronics modules 14, as well as their means of attachment to the arms 28, 29 and 30, may be varied to suit individual preferences and the needs of the intended application. The details of a form and means of attachment found advantageous for MWD applications are shown in FIGS. 2 and 5. A plurality of semiconductor chips, such as chip 15 (FIG. 5), are located within leadless chip carrier packages 16 covered by lids 17 and disposed on a thick film ceramic microelectronics substrate 18. The substrate 18 is installed within the base of a microelectronics socket 19 so that connection pads of the substrate 18 are in contact with the ends of pins of the base 19 which establish contact with the circuit pattern etched on an underlying printed circuit board 37, common to modules 14a, 14b and 14c (see FIG. 1). For rigidity and heat conductivity, the circuit board 37 is clad with a plate 36 of beryllium copper. The electronics modules are secured to the faces of the arms of chassis 24 by suitable fasteners 40 (see FIG. 2).

The described configuration provides good heat dissipation features. The socket lid 38 abuts the back of substrate 18. The lid 38 is advantageously constructed of anodized aluminum to serve as a heat sink and includes fins 39 for radiating heat away from the module 14 outwardly for transmission through the walls of the housing 12 to the flowing drilling mud. The front of the substrate 18 which carries the packages 16 faces the heat conducting plate 36 through a central opening 41 in the socket base 19. The plate 36 preferably extends the length of the circuit board 37. The fastening elements 40 (see FIG. 2) may take the form of a plurality of threaded, heat conducting screws 40 extending at convenient locations through the lid 38, base 19, plate 36 and board 37 into corresponding holes 42 on the chassis 24. The elements 40 thus establish thermal communication between the plate 36, the chassis 24 and the heat radiating lid 38. Extensive thermal communication paths are thus provided for quickly and efficiently dissipating heat away from the components of the electronics modules 14 of the assembly 10. The metallic plates 36', 36" and socket lids 38', 38" shown in FIG. 2 serve the same heat dissipation function for the respective modules 14' and 14". Moreover, the entire system is in thermal communication because of common connection to the chassis 24.

The interior channels 50, 50' and 50" (see FIG. 2) formed by the spaces left between the inner surfaces of the boards 37, 37' and 37" and the outer surfaces of the opposing arms 28, 29 and 30 and the core 26 of the chassis 24 provide excellent cabling runs for establishing electrical connections for the modules 14. A communication path for electrical and/or hydraulic connections between adjacent end-to-end assemblies 10 may advantageously be provided by means of a central bore 60 that runs the length of the core 26 of the chassis 24. It is noted that the bore 60 serves to reduce the weight of the chassis 24 without decreasing its stiffness appreciably.

The roller supports 20 and 22 (FIGS. 1, 3 and 4) act to support the chassis 24 within the housing 12 and to cradle the electronics modules 14 from the effects of externally applied forces due to vibration and shock.

They are constructed to provide both energy dissipation and redirection of energy away from the electronics. The use of rollers 70 serves to facilitate insertion and withdrawal of the assembled electronics from the pressure housing 12. As seen in FIG. 3, the support 22 comprises mountings 62, 63 and 64 which are attached between respective adjacent pairs of the arms 28, 29 and 30 of the chassis 24. For example, roller mounting 62 is attached to arms 29 and 30.

Figure 4:
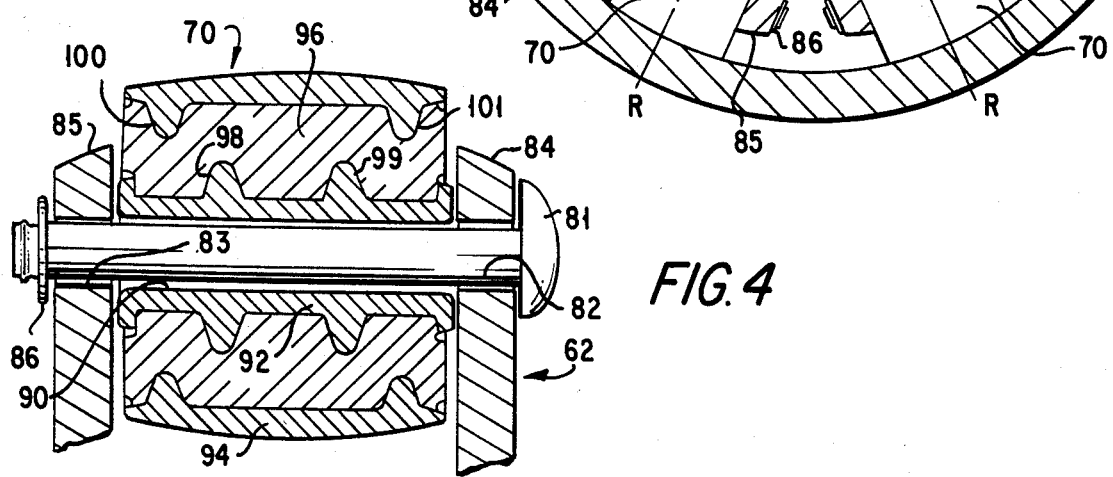
FIG. 4 is a section view taken along line 4—4 of FIG. 1.

Each roller mounting 62, 63, 64 has mounted thereon two doughnut-shaped rollers 70 of identical construction (see FIGS. 3 and 4). The rollers 70 are rotationally mounted between corresponding outwardly-extending flanges 84 and 85 of the roller mounting 62 by means of button head pins 81 that extend through central roller bores 90 into opposing openings 82 and 83 in the flanges 84 and 85. The pins 81 are locked in place by snap rings 86 that lock into grooves at the free ends of the pins.

For each roller mounting, the flanges 84 and 85 extend in directions generally parallel to a radial line "R" (see FIG. 3) drawn from the center of the "Y"-shaped chassis 24 through the center of the mounted roller 70. The embodiment shown in FIG. 3 has an angular displacement of about 50° between a first radial line "R" extending through a roller 70 and a second radial line "R" extending through a second roller 70. The openings 82 and 83 are positioned so that the pin 81 lies perpendicularly to the line "R", with the furthest radial extent of the mounted roller prior to insertion into the housing 12 being slightly greater than the inside radius of the housing. The rollers 70 must therefore be "preloaded" (i.e. forced radially inward) during insertion of the assembly into the housing 12. This "preloading" effects a rolling, yet firmly supporting, energy absorbing carriage to support the electronics within the pressure housing 12. The roller surfaces are configured to match the shape of the inner walls of the housing 12. As described more fully below, the rollers 70 have a composite metal-elastomer-metal construction so that they are both resilient enough for energy absorption and preloading, yet rigid enough for rolling.

As seen in FIG. 1, the mounting flange pairs 84, 85 of adjacently mounted rollers 70 are slightly displaced axially of the chassis 24 to provide better dissipation of external forces. This has the added advantage of accommodating insertion and removal of the pins 81.

Significant advantages result from the construction of the roller assembly members as illustrated in FIGS. 1 and 3. First, the rollers act as an energy absorbing means, isolating the electronic circuits attached to the chassis 24 from impulse type shocks applied to the pressure housing 12. Likewise, the rollers 70 serve to dampen vibrations applied to the pressure housing 12 to reduce the number and amplitude of vibrations transmitted to the electronics. These features are extremely advantageous to electronic circuits which must work for long periods of time in the harsh drilling environment of a measurements-while-drilling system.

The rollers 70 preferably have a composite metal-elastomer-metal construction as shown in FIG. 4, with elastomer material 96 sandwiched between coaxial internal and external metal sleeves 92 and 94. The internal sleeve 92 which borders the cylindrical central bore 90 may be of stainless steel; the external sleeve 94 which contacts the walls of housing 12 may be of beryllium copper, and the intermediate elastomeric material 96 may be a silicone rubber.

Advantageously, the outside of the internal sleeve 92 is configured with radial outwardly-extending ridges 98 and 99. Similarly, radial inwardly-extending ridges 100 and 101 are provided on the inside of external sleeve 94. The ridges 98, 99, 100 and 101 provide greater bonding surface area for adhering the metal surfaces to the elastomeric material 96. The ridges are offset as shown in FIG. 4, with the ridges 98, 99 located between the ridges 100, 101, in order to prevent crushing deformation and/or extrusion of the elastomeric material when the rollers are subjected to extreme forces.

Thus, there has been provided according to a first embodiment of the invention an electronics packaging system, suitable especially for the hostile operating environment of downhole MWD tools, having a "Y"-shaped cross-sectional chassis on the periphery of which are attached a plurality of electronics modules in a "delta" configuration to give a rigid, high density assembly with convenient cabling channels running axially of the chassis. Roller supports provided on the ends of the chassis isolate the electronics from the vibration and shock forces experienced by the housing and also permit easy rolling of the chassis assembly into and out of the housing. The metal-elastomer-metal construction of the rollers offers the resiliency needed for vibration dampening and shock absorption, as well as the rigidity needed for rolling and controlling the direction of application of the undissipated forces. Heat sinks are provided both above and below electronics elements to rapidly disseminate localized heat and to radiate heat generally through the housing walls to an external cooling medium, such as passing drilling mud in oilwell drilling applications.

FIGS. 6-10 illustrate a modified form of an electronic packaging assembly 110, according to a second embodiment of the invention.

Figure 6:
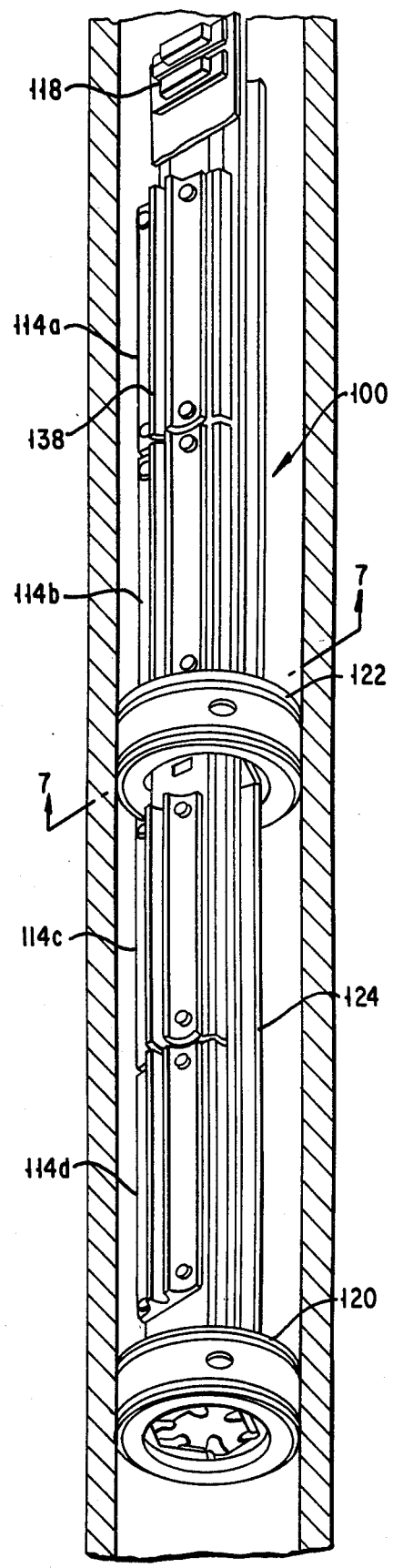
FIG. 6 is a perspective view of a modified form of the electronics packaging system of FIG. 1.

The assembly 110 has four electronics modules 114a, 114b, 114c, and 114d mounted end-to-end between an adjacent pair of arms of a "Y"-shaped chassis 124 similar to the arrangement previously described. However, in place of the roller supports 20 and 22 (FIG. 1), supports in the form of axially-spaced annular shoes 120, 122 are provided along the length of the chassis 124. As with the first embodiment (see FIG. 2), additional electronics modules can be mounted between second and third adjacent pairs of the arms of the chassis 124 to give a high density electronics packaging arrangement similar to that previously described. The modules 114 may be similar to the modules 14 shown in FIG. 5. The socket lids 138 of the modules 114 are shown in FIG. 6 to have a slightly different radiating fin contour than the lids 38 of the modules 14. Different types of electronics modules, such as the package 118, shown in FIG. 6, may also be mounted between arms of the chassis 124. The electronics package 118 may, for example, contain hybrid circuits or other oversized circuitry usable for sensing and related tasks in a downhole MWD tool.

The shoe supports 120 and 122 serve the same isolation function as the roller supports 20 and 22, described above. The arrangement shown in FIG. 6 includes a third shoe support (not shown) which is positioned beyond the module 118.

Figure 7:
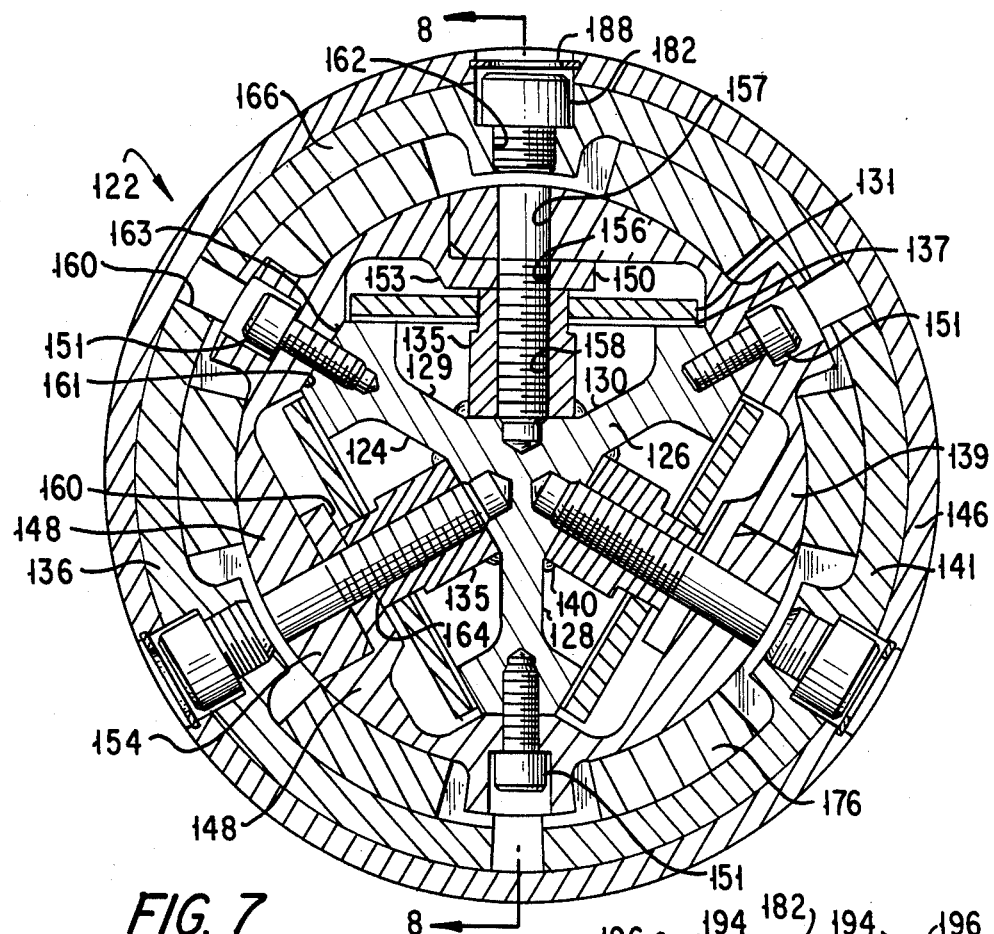
FIG. 7 is a section view taken along the line 7—7 of FIG. 6.
Figure 8:
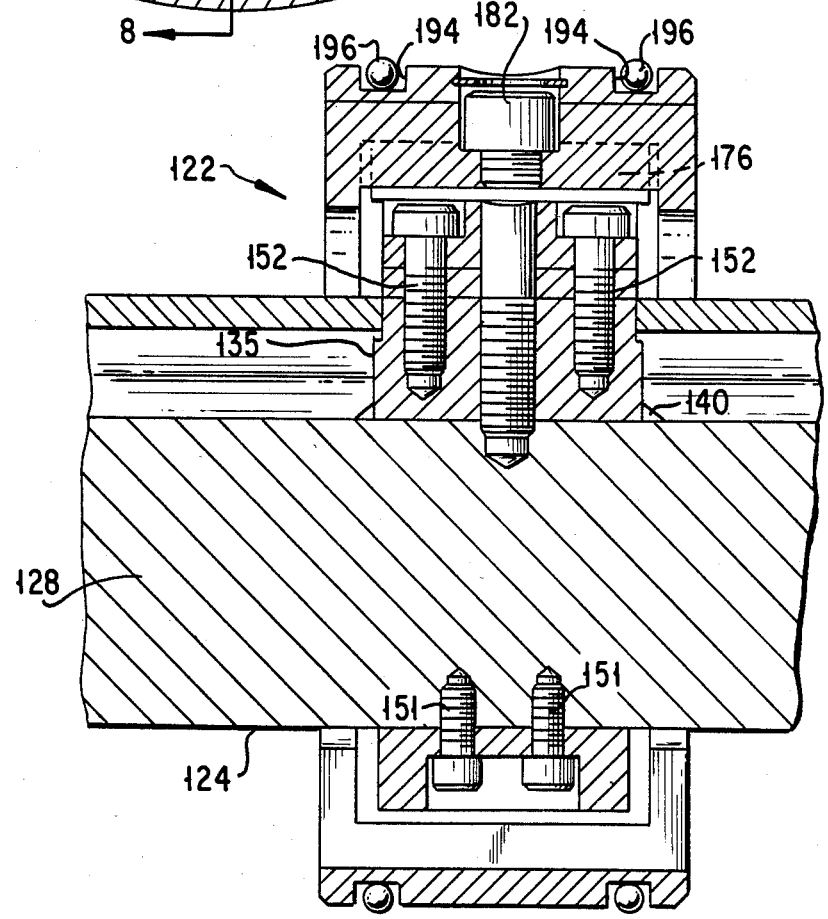
FIG. 8 is a section view taken along the line 8—8 of FIG. 7.
Figure 9:
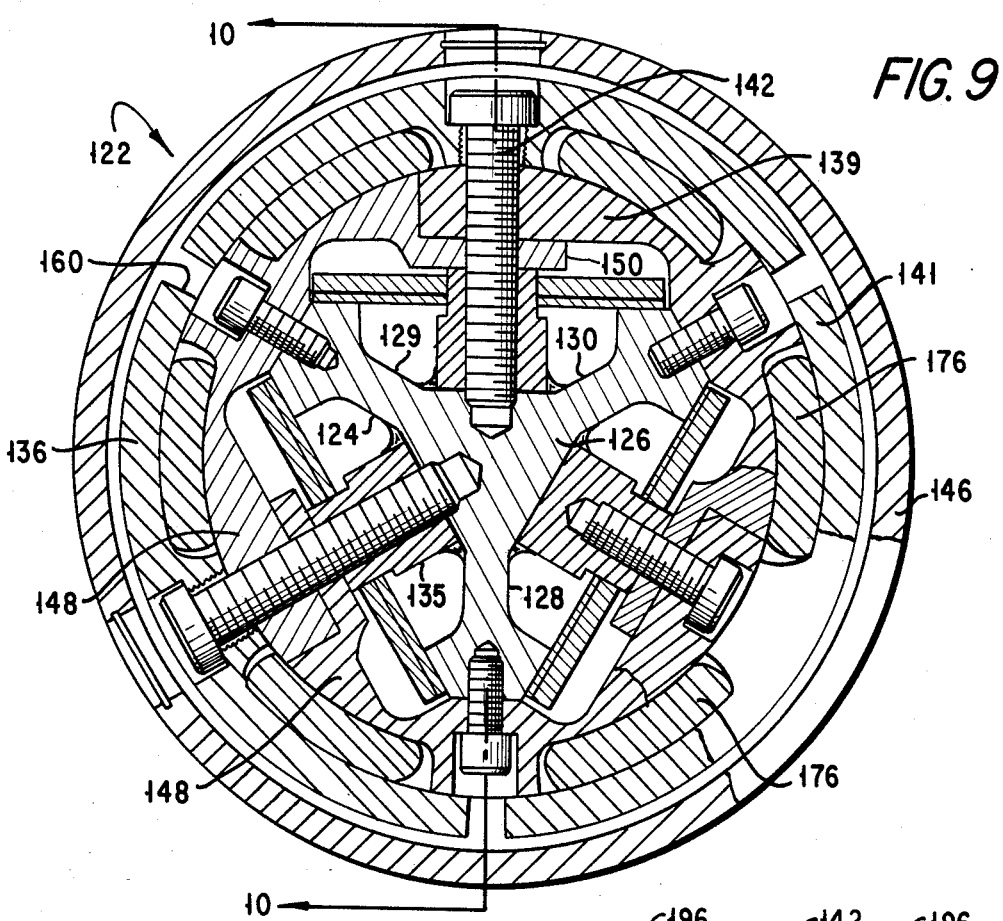
FIG. 9 is a view similar to that of FIG. 7, illustrating a step in the assembly of the modified embodiment shown in FIGS. 6–8.
Figure 10:
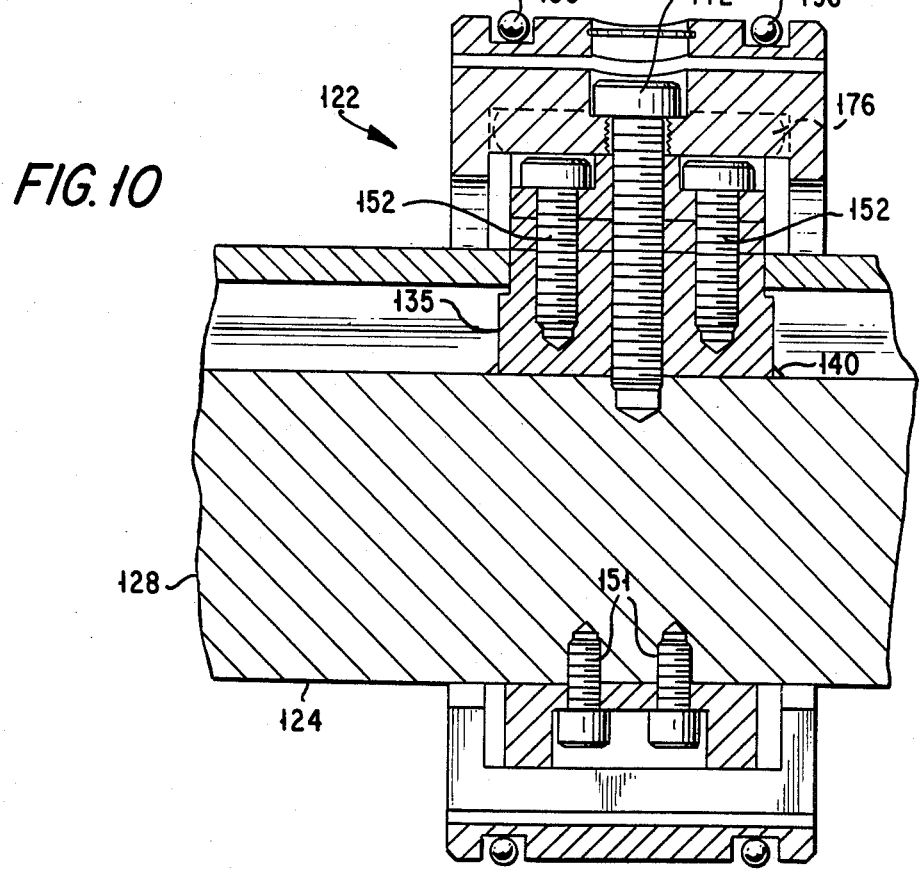
FIG. 10 is a section view taken along line 10—10 of FIG. 9.

The details of construction of the annular supports 120, 122 are shown in FIGS. 7 and 8 (FIGS. 9 and 10 serve to illustrate a step in the assembly of those supports.

The shoe support 122 (FIGS. 7 and 8) is made up symmetrically relative to the chassis 124. As with the chassis 24 above, the chassis 124 comprises a central core 126 and three arms 128, 129 and 130 extending radially outward therefrom to give a "Y"-shaped cross-section. Radially extending anchoring posts 135 are respectively attached to the core 126 of the chassis 124 at positions between adjacent pairs of the arms 128, 129 and 130. The posts 135 may be secured to the core 126 by welds 140, as shown in FIGS. 7 and 8, or they may be formed integrally with the chassis 124. Each post 135 has three axially-spaced radial bores therein, as shown in FIG. 8.

The common printed circuit 137 and the metal cladding 131 are apertured to accommodate the protrusion therethrough of the post 135. The post 135 is positioned and dimensioned relative to the board 137 so that the board 137 will not be stressed by compression due to normal operating forces experienced by the supporting structure 122. In particular, there is a gap between the inner surface of the "jigsaw" superstructure 139 (described below) and the outer surface of the board 137.

As shown in FIGS. 7 and 8, a symmetrical "jigsaw" superstructure 139, comprising interlocking elements 148, surrounds the "Y"-shaped chassis 124 and includes inwardly depending portions 150, as illustrated, that rest atop the posts 135. The superstructure 139 is secured to the chassis 124 by threading two bolts 151 into corresponding axially-spaced radial bores in each of the arms 128, 129 and 130. The superstructure 139 is also secured to the posts 135 by threading two bolts 152 (FIG. 8) into corresponding axially-spaced radial bores in each post 135.

The interlocking elements 148 are of identical arcuate form with one circumferential end formed into an underlapping portion 153 and the other circumferential end formed into an overlapping portion 154. The underlapping and overlapping portions 153, 154 are relatively configured so that the underlapping portion 153 of one element 148 will mate in abutting relationship with the overlapping portion 154 of an adjacent element 148. The underlapping and overlapping portions 153, 154 include bores 156, 157 therethrough positioned so as to line up with each other and with a central bore 158 in the post 135 when the "jigsaw" superstructure 139 is assembled about the chassis 124. The assembled superstructure 139 has a circular appearance extending coaxially around the chassis 124. The inner surface of the superstructure 139 has tangential surfaces 160 and 161 that are in flush contact with corresponding tangential surfaces 163, 164 of the arms 128, 129, 130 and the posts 135.

A peripheral shoe assembly 166 surrounds the superstructure 139 and is maintained in spaced relationship thereto by partially compressed, resilient cushioning elements 176. The shoe assembly 166 comprises an outer ring 146 and an inner retainer assembly 141. As shown in FIG. 7, the inner retainer assembly 141 comprises three arcuate segments 136 separated by gaps 160 which allow the effective perimeter of the retainer assembly 141 to decrease. The segments 136 are held in fixed positions relative to the outer ring 146 by means of threaded bolts 182 which pass through apertures in the ring 146 into matching threaded bores 162 formed in central, radially-inward extending portions of the segments 136. The segments 136 are symmetrically positioned above the posts 135, with the bores 162 coaxially aligned above the bores 156 and 157 of the "jigsaw" superstructure 139 and the bores 158 of the posts 135. Snap rings 188 serve to secure the bolts 182 in position.

The diameters of the bores 156, 157 and 158 are equal to each other, but less than the diameters of the bores 162. This permits the use of smaller diameter threaded bolts 142 to compress the cushioning elements 176 below the segments 136 during assembly, as illustrated in FIGS. 9 and 10, until the outer ring 146 can be brought into position. Thereafter, the bolts 142 are removed and replaced with the shorter, larger diameter bolts 182 (FIGS. 7 and 8), expanding the effective perimeter of the inner retainer assembly 141 to the limit established by the inside diameter of the outer ring 146. The cushioning elements 176 remain in a partially compressed ("preloaded") state, cradling the "jigsaw" superstructure 139 (and the therein-mounted chassis 124) in energy absorbing fashion within the peripheral shoe assembly. A silicone elastomer will serve as a suitable material for the elements 176.

The outside surface of the outer ring 146 is shaped to fit within the inner contour of the protective housing 112. Elastomer "O"-rings 196 (see FIG. 8) are advantageously provided within annular grooves 194 peripherally of the shoe ring 146. The "O"-rings 196 have a slightly larger outer diameter than the outer ring 146, so that metal-to-metal contact over the entire width of the sleeve will be replaced by the metal-to-elastomer contact of the "O"-rings during the process of sliding the assembly into and out of the housing. The outer diameter of the "O"-rings 196 is also slightly larger than the inner diameter of the housing 112, so that these rings are "preloaded" upon insertion into the housing 112 in order to dampen a high frequency ringing experienced during operation due to the metal-to-metal contact that would otherwise exist. The preloaded "O"-rings act to compensate for inequalities of the tolerance between the outer ring 146 and the inside of the housing 112.

Significant advantages result from the structure of the shoe supports 120, 122 of FIGS. 6–10. The shoe assembly, cushioning element, "jigsaw" superstructure configuration of the assembly 110 acts in a similar way to the metal-elastomer-metal roller configuration of the assembly 10 of FIGS. 1–5. The electronics modules 114 carried on the chassis 124 are isolated by the cushioning elements 176 from the effects of impulse type shocks applied to the protective housing 112. These same elements 176 serve to dampen vibrations applied to the housing 112, thereby preventing their transmission to the electronic circuitry. These features are especially advantageous for electronics which must work over long periods of time in the harsh downhole oilwell drilling environment.

Having thus described the invention with particular reference to the preferred forms thereof in the context of an electronics packaging system usable in connection with the harsh downhole environment experienced during operation by MWD tools, it will be obvious to those skilled in the art to which the invention pertains, after understanding the invention, that various changes and modifications may be made therein without departing from the spirit and scope of the invention as defined by the claims appended thereto.

What is claimed is:

1. A high density electronics packaging system adapted for use in a hostile environment, such as usable for packaging the electronics circuitry of a measurements-while-drilling well tool, comprising:
   a protective housing;
   an elongated, rigid chassis of unitary construction having a central core and a symmetrical arrangement of at least three arms extending at equall angles radially therefrom along the length thereof;

a plurality of longitudinally extending electronics modules respectively mounted lengthwise of the chassis between different adjacent pairs of the arms;

a plurality of support assemblies axially-spaced along the chassis and serving to mount the chassis in isolation within the interior of the protective housing, the support assemblies comprising means to maintain the chassis and electronics modules away from the walls of the housing and means to protect the electronic modules from adverse effects due to external forces applied to the housing; and means positioned above and below the electronics modules to convey heat away from the electronics modules.

2. An electronics packaging system as in claim 1, wherein the chassis has three arms extending radially from the core at angles of approximately 120 degrees; and wherein the electronics modules comprise first, second and third electronics modules respectively mounted between first, second and third adjacent pairs of the arms of the chassis, with the first, second and third modules presenting a generally "delta"-shaped cross-sectional configuration.

* * * * *